United States Patent
Park et al.

(10) Patent No.: US 7,132,723 B2
(45) Date of Patent: Nov. 7, 2006

(54) MICRO ELECTRO-MECHANICAL SYSTEM DEVICE WITH PIEZOELECTRIC THIN FILM ACTUATOR

(75) Inventors: Joon Park, Gardena, CA (US); Ron K. Nakahira, Buena Park, CA (US); Robert C. Allison, Rancho P.V., CA (US)

(73) Assignee: Raytheon Company, Waltham, MA (US)

( * ) Notice: Subject to any disclaimer, the term of this patent is extended or adjusted under 35 U.S.C. 154(b) by 50 days.

(21) Appl. No.: 10/294,413

(22) Filed: Nov. 14, 2002

(65) Prior Publication Data

US 2004/0094815 A1     May 20, 2004

(51) Int. Cl.
*H01L 21/00* (2006.01)

(52) U.S. Cl. .............. 257/419; 257/602; 310/319; 361/283.3

(58) Field of Classification Search ........... 257/414, 257/415, 419, 774, 787, 316, 602; 310/311–320, 310/323.11–323.21, 330–350, 353–371; 333/78, 186, 246; 262/69.9 PZ; 361/278, 361/281, 283.2, 283.3
See application file for complete search history.

(56) References Cited

U.S. PATENT DOCUMENTS

| | | | | |
|---|---|---|---|---|
| 2,708,244 | A | * | 5/1955 | Jaffe .................... 310/358 |
| 4,342,936 | A | * | 8/1982 | Marcus et al. .......... 310/330 |
| 4,868,448 | A | * | 9/1989 | Kornrumpf ............. 310/331 |
| 5,536,963 | A | * | 7/1996 | Polla .................... 257/417 |
| 2002/0050882 | A1 | * | 5/2002 | Hyman et al. ........... 335/78 |
| 2002/0096421 | A1 | | 7/2002 | Cohn et al. |
| 2004/0075366 | A1 | * | 4/2004 | Mehta .................... 310/336 |
| 2005/0151444 | A1 | * | 7/2005 | Mehta .................... 310/313 B |

FOREIGN PATENT DOCUMENTS

GB     2353410 A   *   2/2001

OTHER PUBLICATIONS

Jae Y. Park et al., "Micromachined RF MEMS Tunable Capacitors Using Piezoelectric Actuators", Microwave Symposium Digest, 2001 IEEE MTT-S International, pp. 2111-2114, vol. 3, May 25, 2001.*

(Continued)

*Primary Examiner*—Thomas L. Dickey
(74) *Attorney, Agent, or Firm*—Leonard A. Alkov; John E. Gunther; Karl A. Vick

(57) ABSTRACT

A radio frequency (RF) micro electro-mechanical system (MEMS) device and method of making same are provided, the device including an RF circuit substrate and an RF conducting path disposed on the RF circuit substrate, a piezoelectric thin film actuator, and a conducting path electrode. The piezoelectric thin film actuator has a proximal end that is fixed relative to the RF circuit substrate and a cantilever end that is spaced from the RF circuit substrate. The conducting path electrode is disposed on the cantilever end of the piezoelectric thin film actuator. The cantilever end of the piezoelectric thin film actuator is movable between a first position whereat the conducting path electrode is spaced from the RF path electrode and a second position whereat the conducting path electrode is spaced from the RF path electrode a second distance, wherein the second distance is less than the first distance. The RF MEMS device is particularly useful as a tunable capacitor. The RF MEMS device requires lower operating voltage, and provides variable RF tuning capacity, fewer stiction problems, simplified fabrication, and an improved switching time.

53 Claims, 14 Drawing Sheets

OTHER PUBLICATIONS

WO 01/13457 A (Lane Anthony Alan; Marconi Caswell LTD (GB); Needham Anthony Patrick) Feb. 22, 2001, p. 7, line 1—p. 10, line 19; claim 2; figures 1-6.
Park, J.Y., et al, Institute of Electrical and Electronics Engineers: "Micromachined RF MEMS Unable Capacitors Using Piezoelectric Actuators," XP001061195, ISBN: 0-7803-6538-0, p. 2111, p. 2112; figures 1,2.

Patent Abstracts of Japan, Publication No. 2002170470, publication date Jun. 14, 2002, Application No. 2000361975, application date: Nov. 28, 2000, applicant: Matsushita Electric Works Ltd.

* cited by examiner

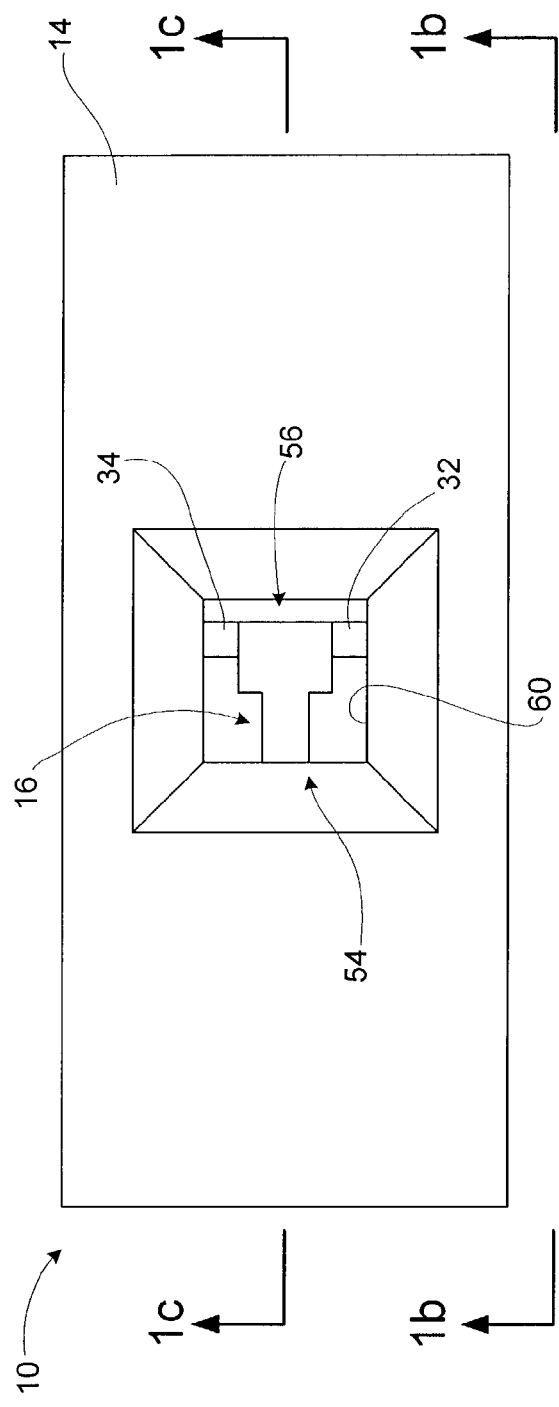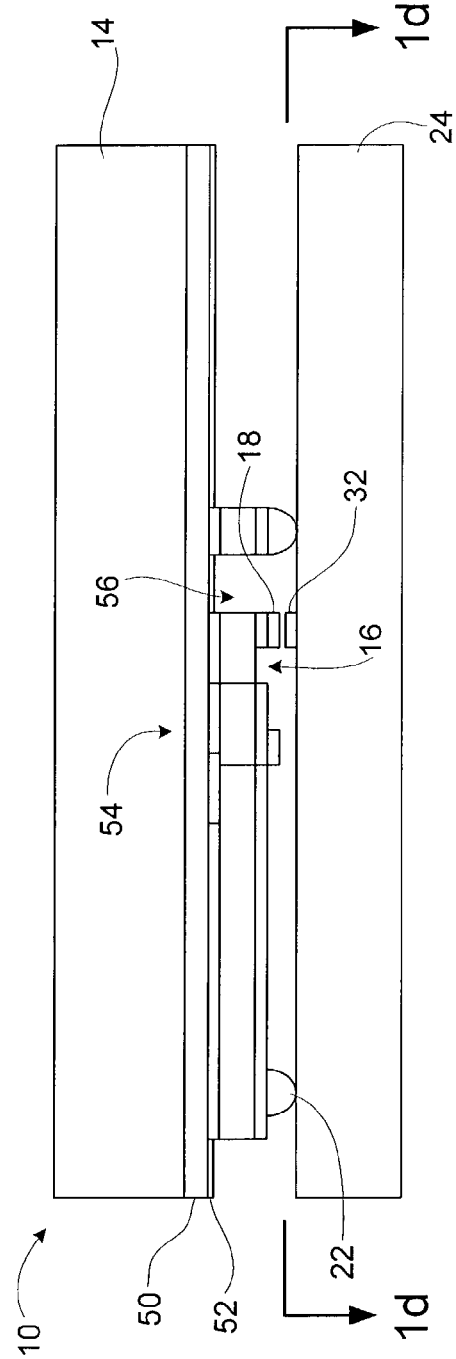

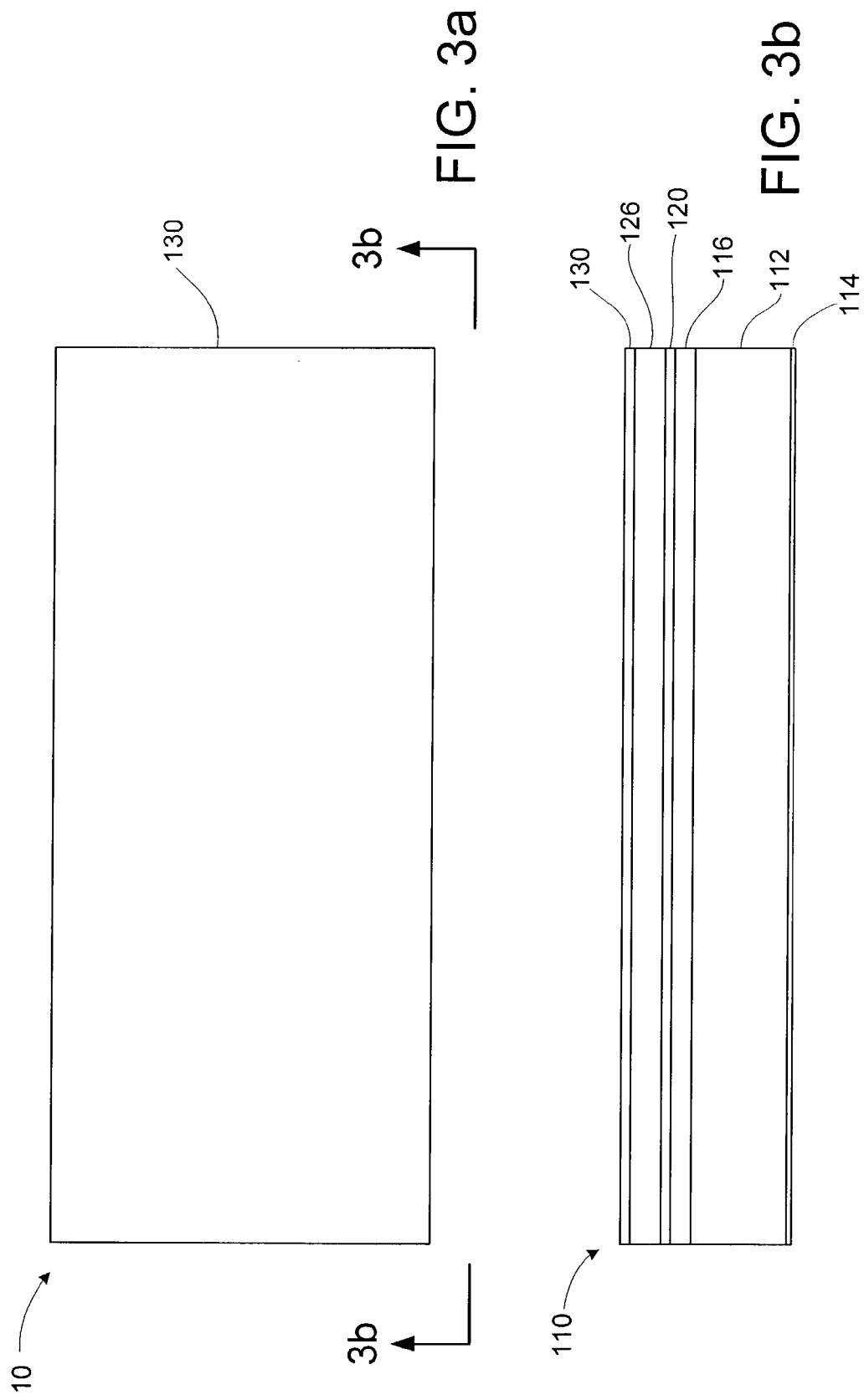

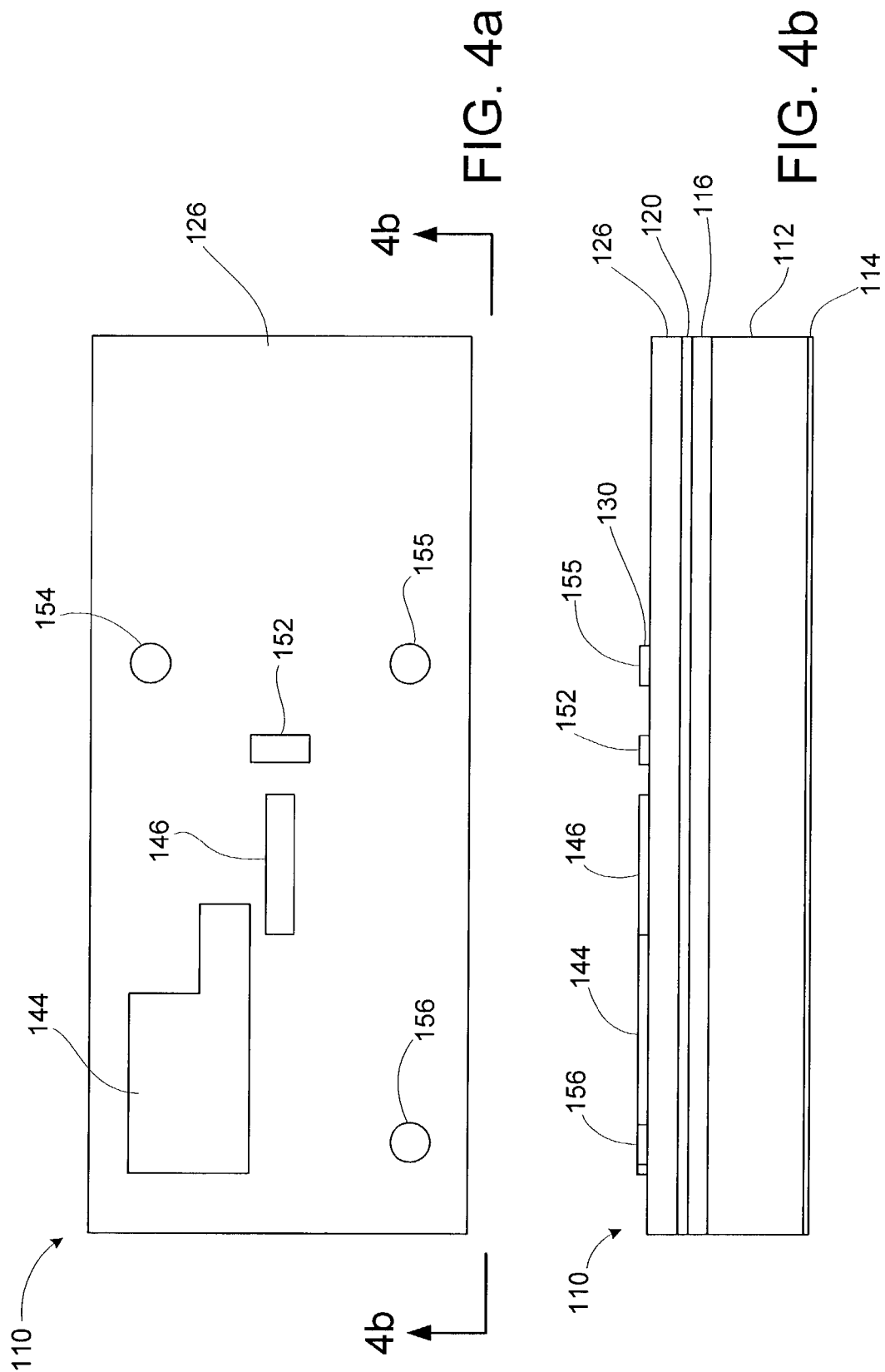

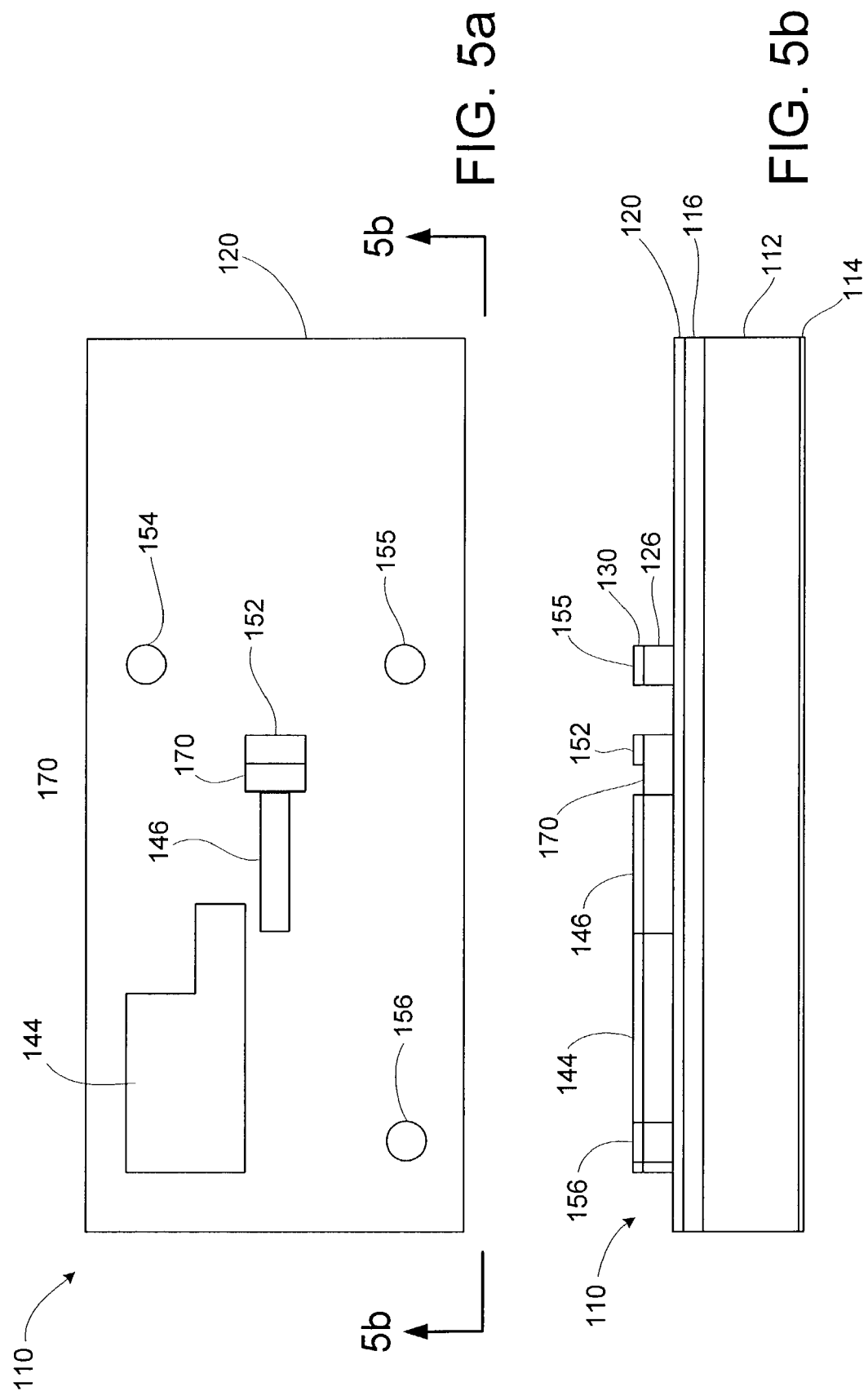

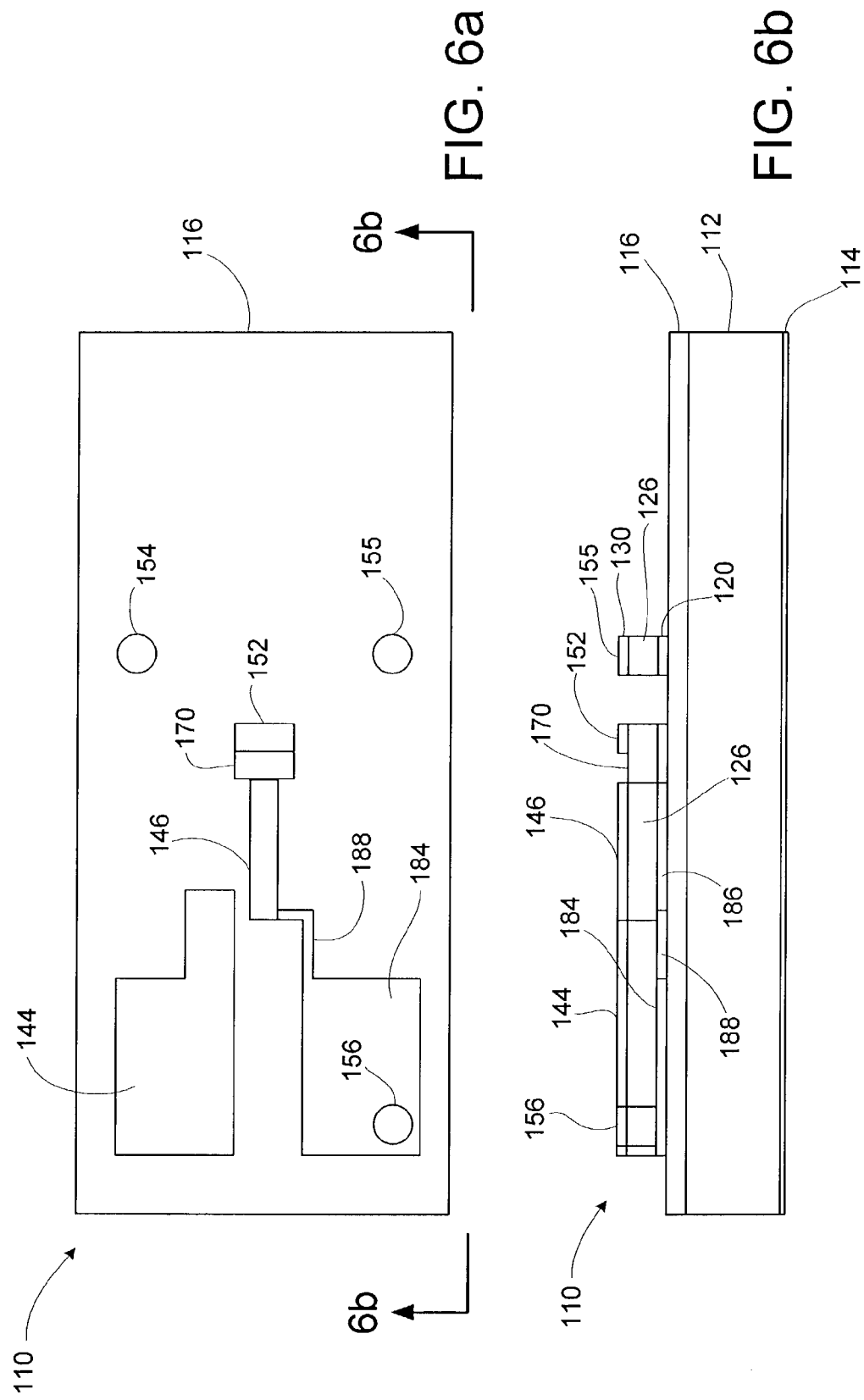

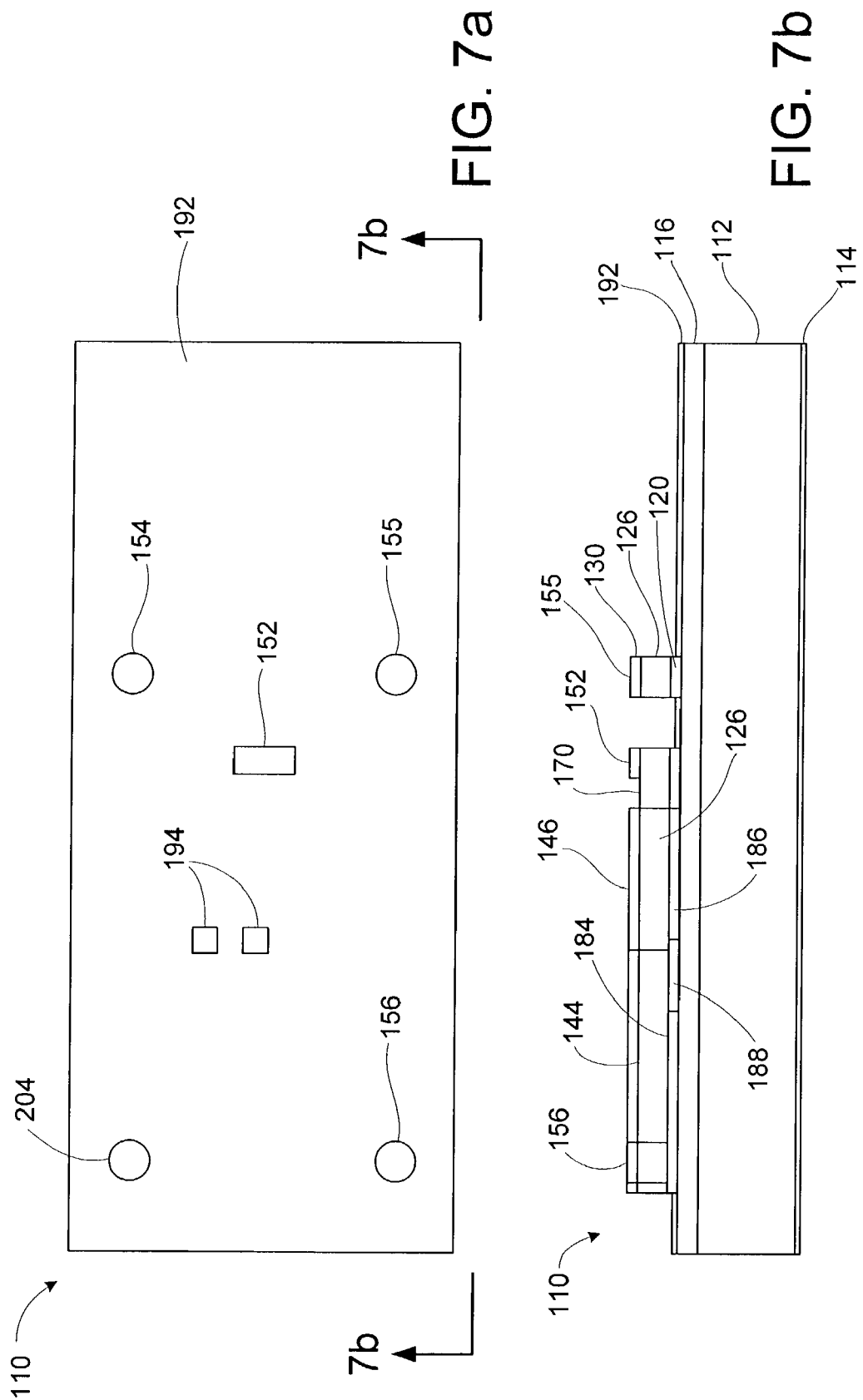

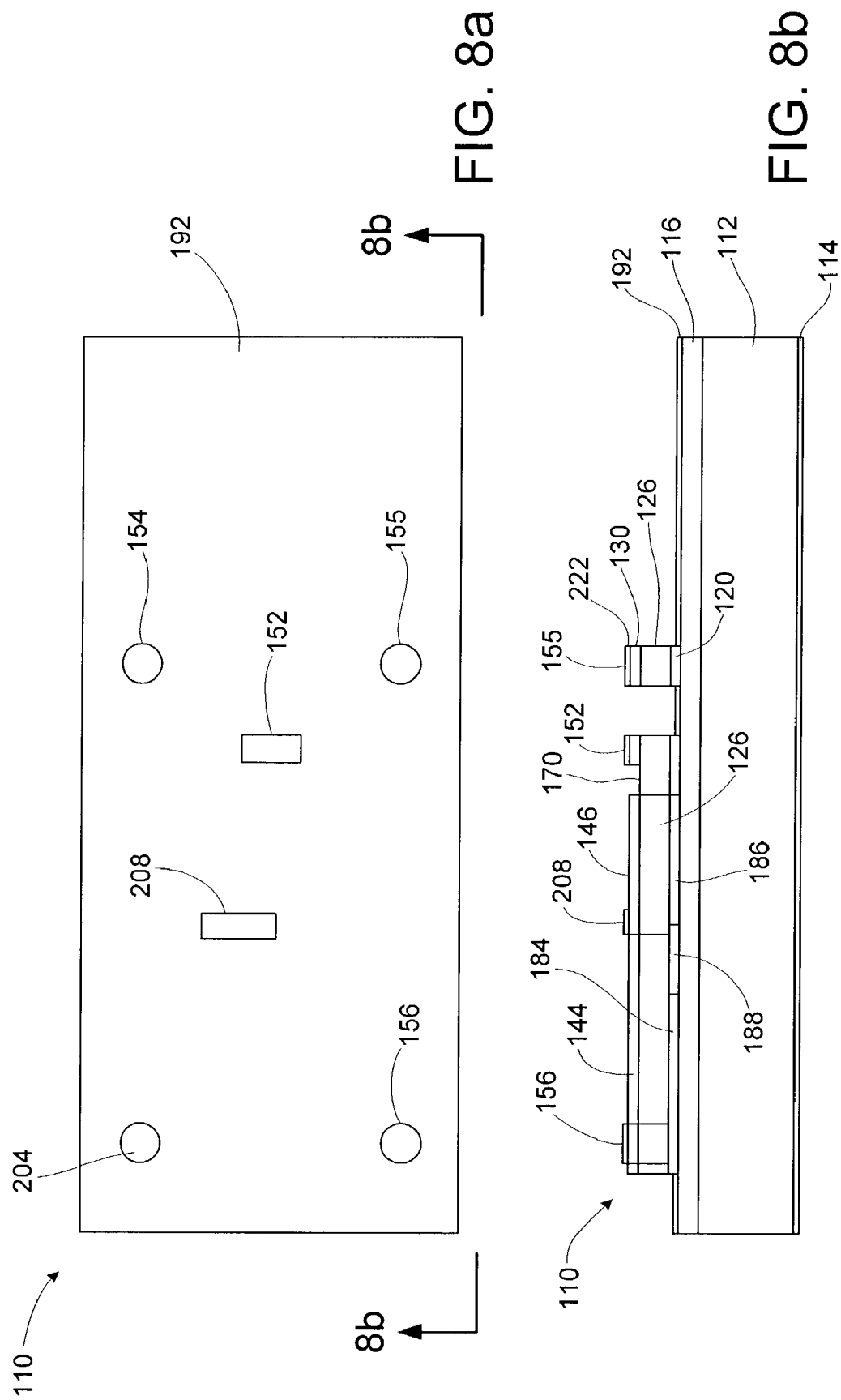

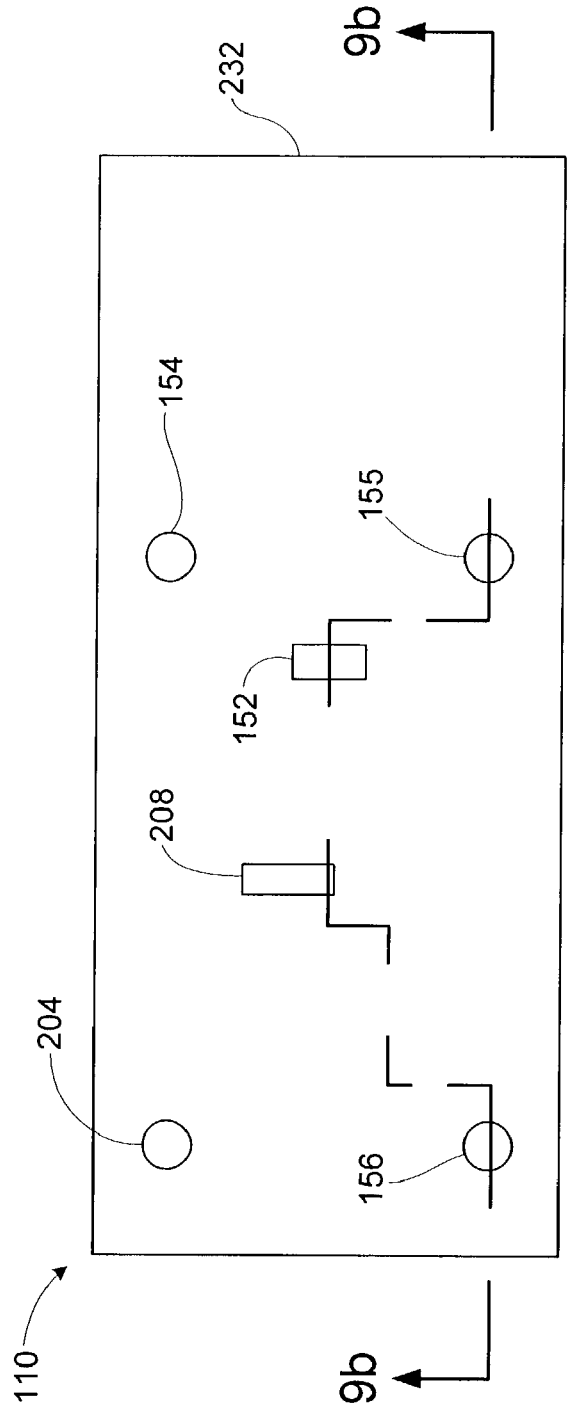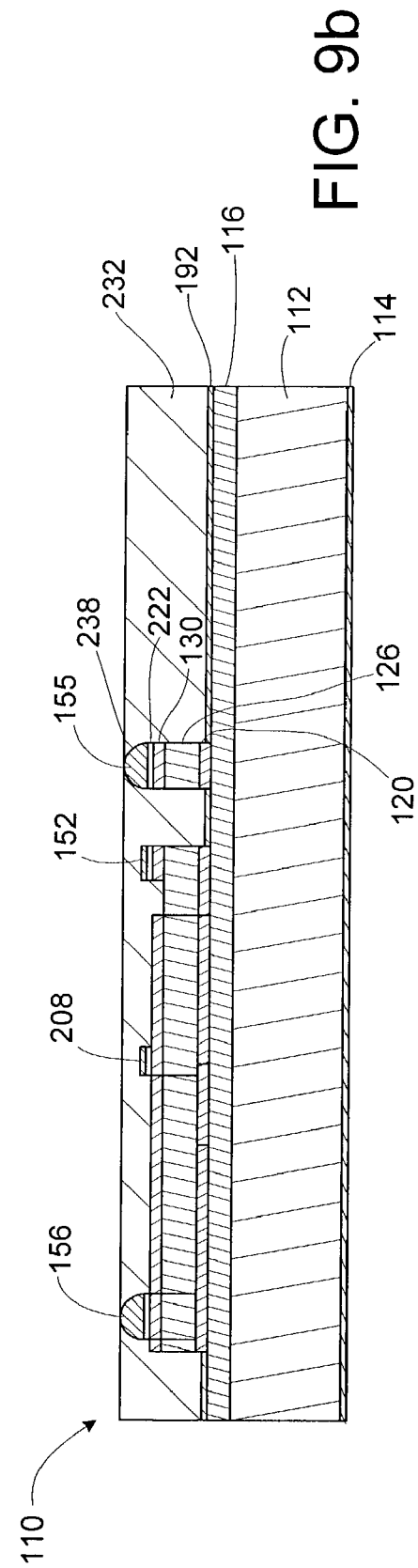

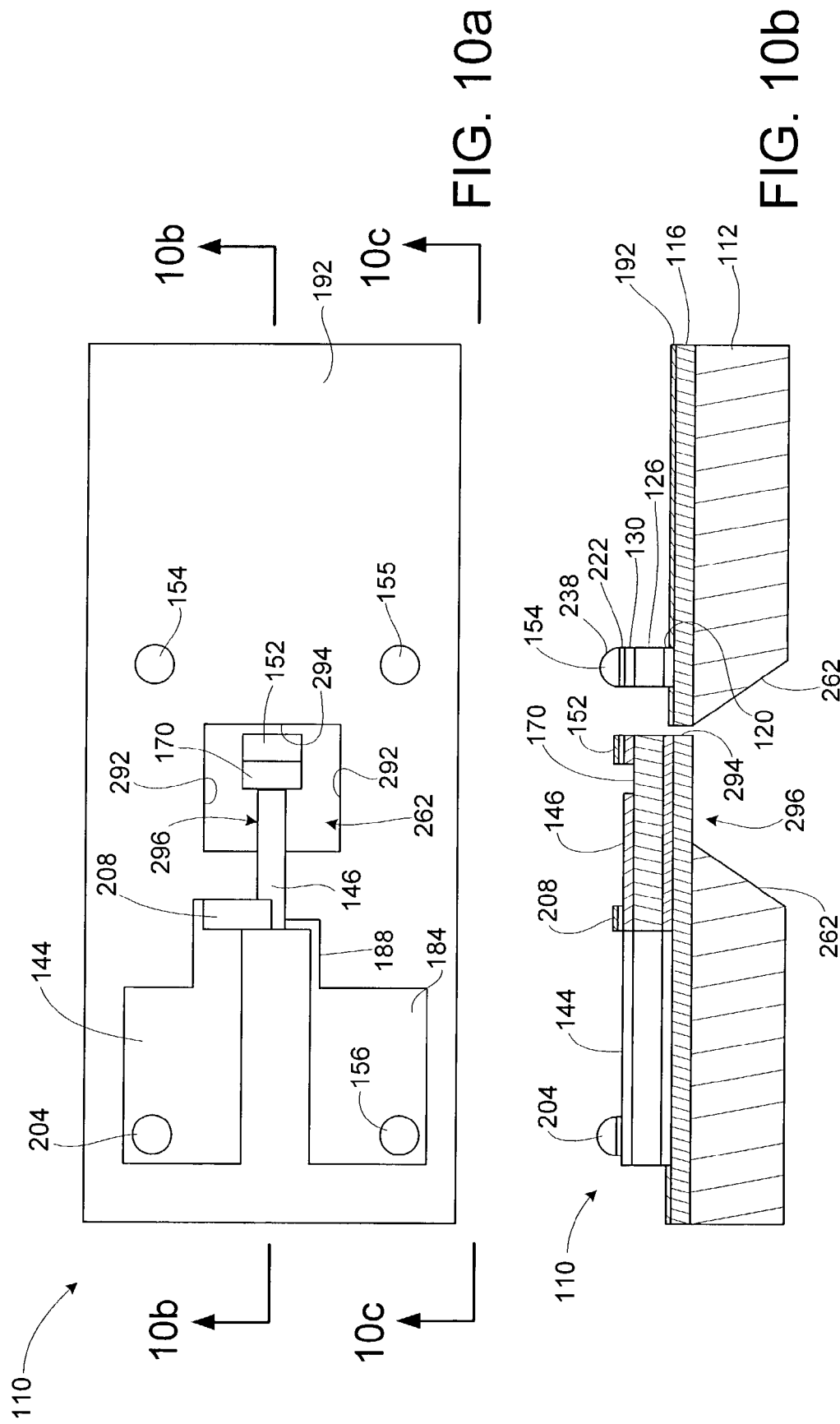

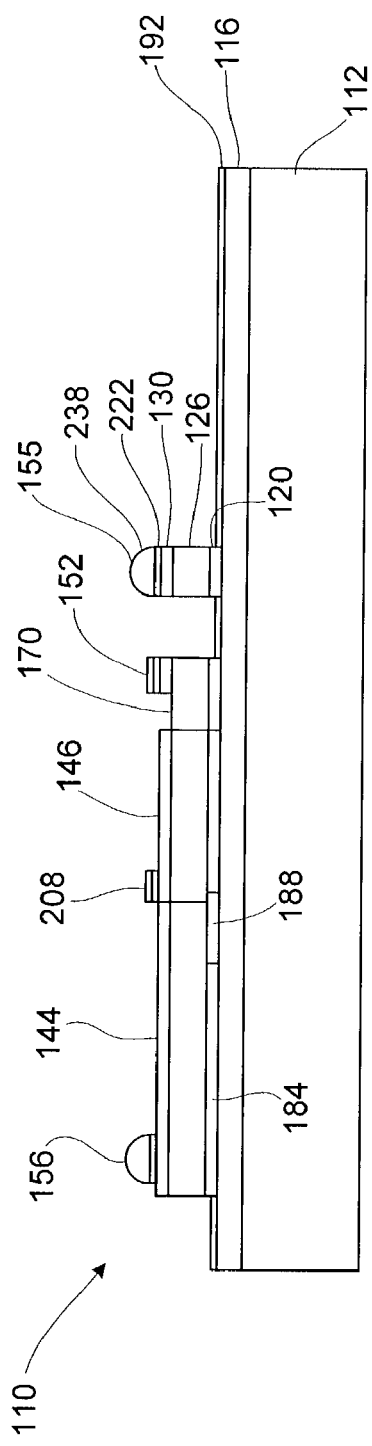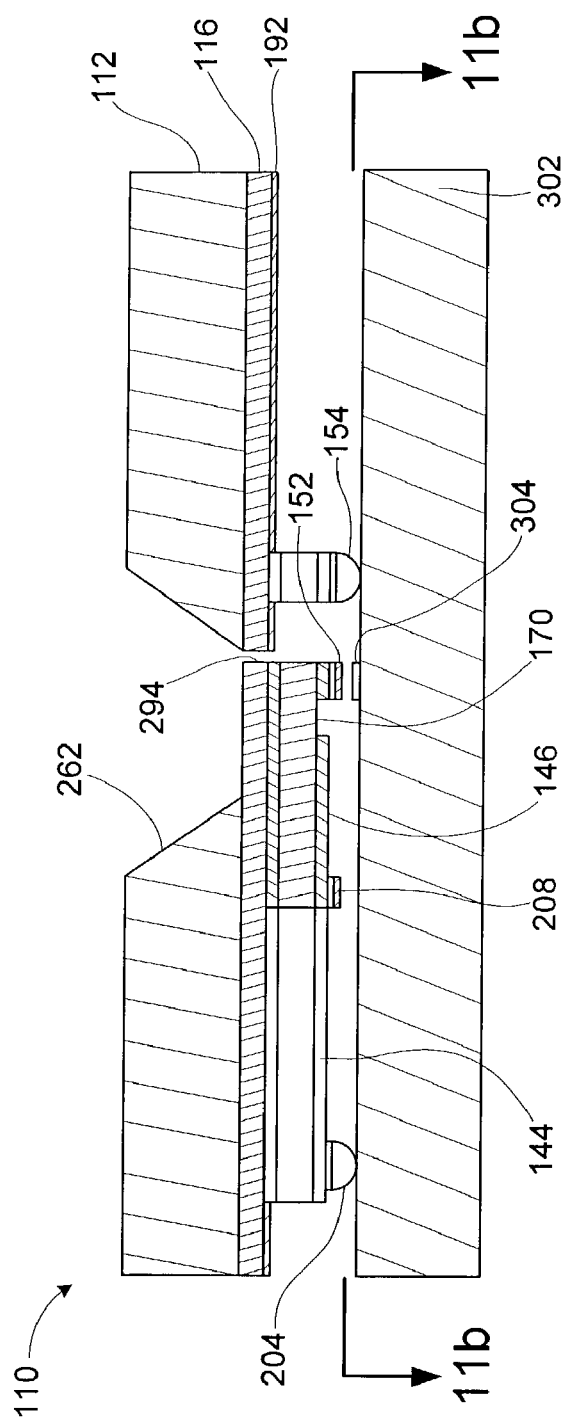

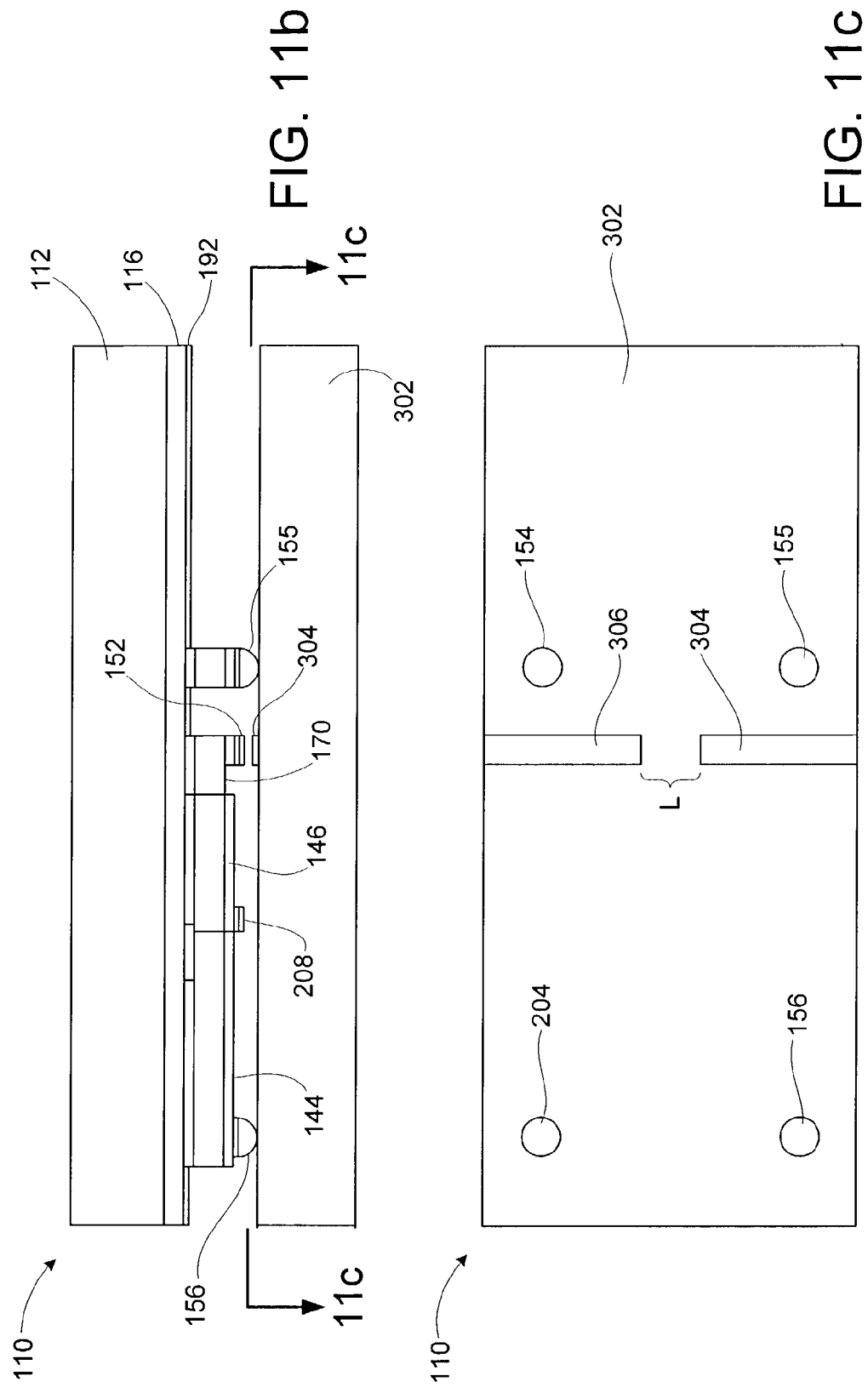

MICRO ELECTRO-MECHANICAL SYSTEM DEVICE WITH PIEZOELECTRIC THIN FILM ACTUATOR

TECHNICAL FIELD

The present invention relates generally to micro electromechanical system (MEMS) radio frequency (RF) devices and methods for forming the same and, more particularly, to a tunable RF MEMS switch with a piezoelectric thin film actuator.

BACKGROUND OF THE INVENTION

Heretofore, radio frequency (RF) microelectromechanical system (MEMS) switches have utilized an electrostatic force or electrothermal actuation to actuate the RF MEMS switch. In a typical electrostatic RF MEMS switch, at least 30 volts may be required to open and close the switch. Consequently, the switch is not suitable for applications such as commercial handheld products, which typically operate on 3 volts or less. The electrostatic RF MEMS switch also is limited in its operation, as it can only be open or closed, that is, either in contact or not in contact. For this reason, the electrostatic RF MEMS switch is not suitable as a tunable capacitor, as such devices typically require controlled variance in the displacement of the actuation beam.

Electrostatic RF MEMS switches also suffer from a well known problem known as stiction, which occurs when surface tension forces are higher than the spring restoring force of the actuator beam. Stiction may be caused by a wet etching process used during fabrication, which may leave some moisture or meniscus which pulls the beam towards the electrode and prevents the beam from releasing. Alternatively, or additionally, stiction may occur during operation, whereby the beam stays in a deflected position due to capillary forces, electrostatic attraction, or direct chemical bonding. Stiction is a major problem of electrostatic RF MEMS switches, oftentimes rendering the switch inoperable.

Electrostatic RF MEMS devices also may require additional fabrication steps, particularly RF MEMS devices requiring high quality frequency performance. Such devices are typically fabricated using RF-compatible substrate materials such as GaAs, ceramics, and high resistivity silicon. According to one technique, an RF circuit is fabricated from an RF-compatible substrate and an actuator is fabricated on a silicon wafer, and then the circuit and actuator are assembled using flip chip technology. Since the silicon has a low resistivity which may interfere with the RF performance of the circuit, typically a switch manufacturer removes the silicon, leaving only the actuator on the RF circuit. For high volume applications, this additional silicon removal step may be quite costly.

Electrothermal actuated devices also are not without drawbacks. The function of an electrothermal actuator depends on the mismatching of the thermal expansion rates of different dimensioned actuator beams. The electrothermal actuator has some limitations such as slower tuning and more space requirements. Moreover, the manufacturing process of electrothermal actuators involves critical design considerations such as temperature distribution and heat sink placement. In operation, the beam is heated by applying a current (Joule heating), causing the beam to move due to the differing expansion rates of the materials forming the beam. Once actuated, however, the beam must cool down in order to return to its original position. Controllably cooling down the beam is difficult, as the amount of time to sufficiently cool the beam oftentimes is not ascertainable or is met with inconsistent results. Although the actuator may be made smaller to reduce its cooling time, the cooling time still cannot be controlled effectively to vary the interelectrode spacing and hence the capacitance between the electrodes. For this reason, the electrothermal MEMS switch is usually employed as a one-way switch rather than a two-way switch or a tunable capacitor.

SUMMARY OF THE INVENTION

The present invention provides a radio frequency (RF) microelectromechanical system (MEMS) device with a piezoelectric thin film actuator. The RF MEMS device provides one or more improved performance characteristics such as a low operating voltage, a variable RF tuning capacity, fewer stiction problems, simplified fabrication, and an improved switching time. Also, the RF MEMS device is relatively small in size and relatively inexpensive to manufacture, making it a desirable for a wide variety of military and commercial applications. For example, the RF MEMS device may be applied in low signal loss switches, phase shifters, filters and receivers for radar and communication products, and wireless consumer and infrastructure products. Moreover, advantageously, the RF MEMS device may be employed as a tunable capacitor in which the interelectrode spacing between a conducting path electrode and an RF path electrode is controllably varied by an actuator beam in order to selectively vary the capacitance between the electrodes.

According to one particular aspect of the invention, there is provided an RF MEMS device, including an RF circuit substrate and an RF conducting path disposed on the RF circuit substrate, a piezoelectric thin film actuator, and a conducting path electrode. The piezoelectric thin film actuator has a proximal end that is fixed relative to the RF circuit substrate and a cantilever end that is spaced from the RF circuit substrate. The conducting path electrode is disposed on the cantilever end of the piezoelectric thin film actuator. The cantilever end of the piezoelectric thin film actuator is movable between a first position whereat the conducting path electrode is spaced from the RF path electrode and a second position whereat the conducting path electrode is spaced from the RF path electrode a second distance, wherein the second distance is less than the first distance.

In an embodiment of the invention, the piezoelectric thin film actuator includes a first electrode, a second electrode, and a piezoelectric layer disposed between the first and second electrodes such that when a voltage potential is applied to the first and second electrodes, the piezoelectric layer expands or contracts longitudinally.

In another embodiment of the invention, the piezoelectric thin film actuator includes an elastic layer disposed on the second electrode such that the elastic layer converts the longitudinal expansion or contraction of the piezoelectric layer into transverse movement of the cantilever end of the piezoelectric thin film actuator.

In another embodiment of the invention, the first electrode and second electrode include a layer of platinum or other suitable conducting material. Also, the elastic layer of the piezoelectric thin film actuator may include a layer of silicon nitride or a layer of silicon dioxide.

In an embodiment, the piezoelectric layer has a thickness between about 4500 and about 5500 Angstroms (Å). The elastic layer may have a thickness in the range of between about 0.95 microns (μm) and about 1.65 microns (μm). The first and second electrodes may have a length in the range of about 300 microns (μm) and about 500 microns (μm). In an embodiment, the first and second electrodes have a width between about 100 microns (μm) and about 150 microns (μm).

In another embodiment of the invention, the conducting path electrode is transverse the longitudinal extent of the piezoelectric thin film actuator and has a width between about 90 microns (μm) and about 110 microns (μm).

In yet another embodiment of the invention, the RF path electrode includes an RF-in path electrode and an RF-out path electrode, each extending transverse the piezoelectric thin film actuator, wherein the RF-in and RF-out path electrodes are spaced apart by a gap L. In such arrangement, the conducting path electrode may be transverse the longitudinal extent of the piezoelectric thin film actuator and have a length at least as long as the gap L between the RF-in and RF-out path electrodes.

In an embodiment of the invention, the conducting path electrode is spaced from either of the first and second electrodes by an isolation region to prevent any electric field from the conducting path electrode to the first and second electrodes, or vice versa.

In an embodiment of the invention, the RF circuit substrate includes a GaAs layer.

According to another aspect of the invention, there if provided a method for manufacturing an RF MEMS device, including the steps of providing an RF circuit substrate with an RF conducting path disposed on the RF circuit substrate, fabricating a piezoelectric thin film actuator having a proximal end and a cantilever end, providing a conducting path electrode on the cantilever end of the piezoelectric thin film actuator, assembling the piezoelectric thin film actuator to the RF circuit substrate so that the proximal end is fixed relative to the RF circuit substrate and the cantilever end is spaced from the RF circuit substrate, and so that the cantilever end of the piezoelectric thin film actuator is movable between a first position whereat the conducting path electrode is spaced from the RF path electrode and a second position whereat the conducting path electrode is spaced from the RF path electrode a second distance, and wherein the second distance is less than the first distance.

In an embodiment of the invention, the step of forming the piezoelectric thin film actuator includes providing a multi-layer material including a protective layer, a semiconductor layer, an elastic layer, a first conductor layer, a piezoelectric layer, and a second conductor layer, the piezoelectric layer being disposed between the first and second conductor layers. The step of forming the piezoelectric thin film actuator may include, for example, patterning and etching the first conductor layer, the piezoelectric layer and the second conductor layer to form a first electrode, a piezoelectric layer, and a second electrode. The step of providing the conducting path may include patterning and etching the first conductor layer, the piezoelectric layer and the second conductor layer to form the conducting path electrode, wherein the conducting path electrode is spaced from either the first or second electrode by an isolation region formed by the piezoelectric layer. The step of providing the conducting path electrode may include patterning and etching a trench region in the semiconductor layer which has a footprint larger than the cantilever ends of the respective first and second electrodes and the piezoelectric layer disposed therebetween. Still further, a portion of the elastic layer laterally of and longitudinally beyond the cantilever end of the first and second electrodes and the piezoelectric layer therebetween may be removed to thereby release the cantilever end of the piezoelectric thin film actuator from the elastic layer to enable the cantilever end to be moved within the trench region.

In another embodiment of the invention, the step of assembling the piezoelectric thin film actuator to the RF circuit substrate includes using flip chip technology to assemble the piezoelectric thin film actuator to the RF circuit substrate.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1a is a top plan view of a radio frequency (RF) microelectromechanical system (MEMS) device in accordance with the present invention.

FIG. 1b is a side elevational view of the RF MEMS device of FIG. 1a as seen from the plane 1b—1b in FIG. 1a.

FIG. 1c is a cross-sectional view of the RF MEMS device of FIG. 1a as seen from the plane 1c—1c in FIG. 1a.

FIG. 3a is a top plan view of a multi-layer material which illustrates a starting structure of the method of making the RF MEMS device in accordance with the present invention.

FIG. 3b is a side elevational view of the starting structure of FIG. 3a as seen from the plane 3b—3b in FIG. 3a.

FIG. 4a is a top plan view of an intermediate structure of the method of making the RF MEMS device in accordance with the present invention.

FIG. 4b is a side elevational view of the intermediate structure of FIG. 4a as seen from the plane 4b—4b in FIG. 4a.

FIG. 5a is a top plan view of an intermediate structure of the method of making the RF MEMS device in accordance with the present invention.

FIG. 5b is a side elevational view of the intermediate structure of FIG. 5a as seen from the plane 5b—5b in FIG. 5a.

FIG. 6a is a top plan view of an intermediate structure of the method of making the RF MEMS device in accordance with the present invention.

FIG. 6b is a side elevational view of the intermediate structure of FIG. 6a as seen from the plane 6b—6b in FIG. 6a.

FIG. 7a is a top plan view of an intermediate structure of the method of making the RF MEMS device in accordance with the present invention.

FIG. 7b is a side elevational view of the intermediate structure of FIG. 7a as seen from the plane 7b—7b in FIG. 7a.

FIG. 8a is a top plan view of an intermediate structure of the method of making the RF MEMS device in accordance with the present invention.

FIG. 8b is a side elevational view of the intermediate structure of FIG. 8a as seen from the plane 8b—8b in FIG. 8a.

FIG. 9a is a top plan view of an intermediate structure of the method of making the RF MEMS device in accordance with the present invention.

FIG. 9b is a cross-sectional view of the intermediate structure of FIG. 9a as seen from the plane 9b—9b in FIG. 9a.

FIG. 10a is a top plan view of an intermediate structure of the method of making the RF MEMS device in accordance with the present invention.

FIG. 10b is a cross-sectional view of the intermediate structure of FIG. 10a as seen from the plane 10b—10b in FIG. 10a.

FIG. 10c is a side elevational view of the intermediate structure of FIG. 10a as seen from the plane 10c—10c in FIG. 10a.

FIG. 11a is a cross-sectional view of an RF MEMS device achieved as a result of the method of making an RF MEMS device in accordance with the present invention.

FIG. 11b is a side elevational view of an RF MEMS device achieved as a result of the method of making an RF MEMS device in accordance with the present invention.

FIG. 11c is a cross-sectional view of the RF MEMS device of FIG. 11b as seen from the plane 11c—11c in FIG. 11b.

DETAILED DESCRIPTION OF THE INVENTION

Figure 1C:
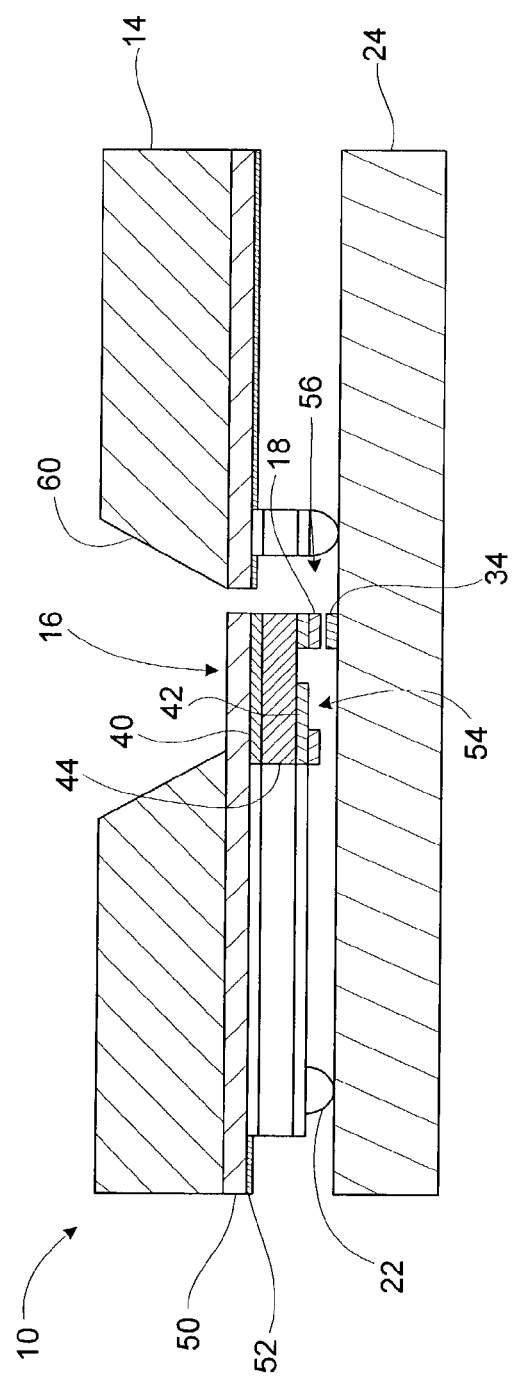

In the detailed description which follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

Referring initially to FIGS. 1a–1d, a radio frequency (RF) microelectromechanical system (MEMS) device 10 according to the present invention is shown. The device 10 includes a semiconductor substrate 14, a piezoelectric thin film actuator 16 mounted on the substrate 14, a conducting path electrode 18 driven by the piezoelectric thin film actuator 16, conductive bumps 22 which are connected to an external voltage source (not shown) and provide the voltage necessary for operating the device 10, an RF circuit substrate 24, and RF-in and RF-out path electrodes 32 and 34 mounted on the RF circuit substrate 24 so as to be spaced from the conducting path electrode 18. The piezoelectric thin film actuator 16 is fabricated in conjunction with the semiconductor substrate 14 and transferred to the RF circuit substrate 24 using flip chip technology, for example. It is noted that in the illustrated embodiment the bumps shown in the right side of FIGS. 1a–1d act as spacers, although the bumps could alternatively form part of another device, if desired.

The piezoelectric thin film actuator 16 may comprise any suitable material having piezoelectric properties, for example, lead zirconate titanate (PZT). Because the invention was conceived and developed in the context of a PZT piezoelectric material, it is described herein chiefly in such context. However, the underlying principles of the invention could be achieved with other piezoelectric materials with advantageous results.

The PZT thin film actuator 16 includes a pair of electrodes 40 and 42, a piezoelectric layer 44 made of lead zirconate titanate (PZT) disposed between the electrodes 40 and 42, and an elastic layer 50 disposed between the electrode 40 (the upper electrode in FIGS. 1b and 1c) and the semiconductor substrate 14.

An isolation layer 52 is provided adjacent the elastic layer 50 and prevents or at least substantially reduces electrical arcing between the 40 and 42. The PZT thin film actuator 16 has a fixed proximal end 54 (the left end in FIGS. 1a–1c) adjacent the semiconductor substrate 14 and a free distal end 56 (the right end in FIGS. 1a–1c) extending into a trench region 60 of the substrate 14. The PZT thin film actuator 16 thus forms a cantilever beam which is moveable within the trench region 60.

Figure 1D:
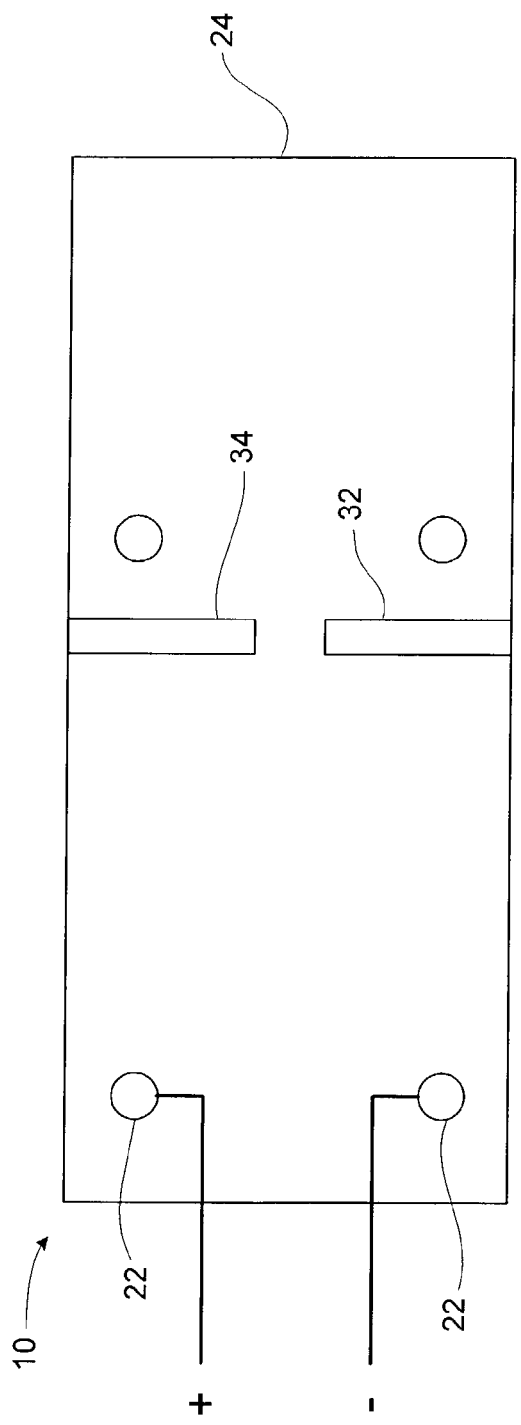
FIG. 1d is a cross-sectional view of the RF MEMS device of FIG. 1a as seen from the plane 1d—1d in FIG. 1b.

In the illustrated exemplary embodiment, the conducting path electrode 18 is transverse the longitudinal extent of the PZT thin film actuator 16. Thus, in FIGS. 1b and 1c the conducting path electrode is perpendicular to the plane of the page. Similarly, the RF-in and RF-out path electrodes 32 and 34 are transverse the longitudinal extent of the PZT thin film actuator 16, as is shown in FIG. 1d.

The RF MEMS device 10 in accordance with the invention may be used as a switch with controllable displacement or as a tunable capacitor for varying the capacitance between the electrodes 32 and 34. During operation, the RF MEMS device 10 changes the distance of the gap between the conducting path electrode 18 and the RF-in and RF-out path electrodes 32 and 34. More particularly, as the voltage source increases and decreases the voltage potential applied to the electrodes 40 and 42, the PZT layer 44 changes its dimension in length, that is, the PZT layer 44 respectively expands and contracts. The elastic layer 50, in turn, converts the expanding and contracting of the PZT layer 44 into upward and downward movement of the cantilevered or distal end portion 56 of the PZT thin film actuator 16. When bent downward, the distal end 56 urges the conducting path electrode 18 closer to or in contact with the RF-in and RF-out path electrodes 32 and 34. When bent upward, the distal end 56 urges the conducting path electrode 18 away from the RF-in and RF-out path electrodes 32 and 34.

The PZT thin film actuator 16 thus actively controls the displacement between the conducting path electrode 18 and the RF-in and RF-out path electrodes 32 and 34. The amount of displacement depends on mainly the driving voltage, and the dimensions of the PZT thin film actuator 16, including the dimensions of the PZT layer 44 and the elastic layer 50. As will be appreciated, alternative piezoelectric materials may have different piezoelectric properties than that of PZT and, consequently, alternative embodiments which may have such alternative piezoelectric materials may result in different amounts of displacement.

When employed as a switch, the RF MEMS device 10 can close the spacing between the conducting path electrode 18 and the RF-in and RF-out path electrodes 32 and 34, and thus turn on the switch, or open the spacing and thus turn off the switch. The RF MEMS device may also employed as a tunable capacitor in which the interelectrode spacing between the conducting path electrode 18 and the RF-in and RF-out path electrodes 32 and 34 is controllably varied by the PZT thin film actuator 16 in order to selectively vary the tuning capacitance therebetween.

It has been found that the RF MEMS device 10 with the PZT thin film actuator 16 provides accurate and precise beam displacement control with improved tuning capacitance range, eliminates or substantially reduces static charges collecting on the conducting path electrode 18 and the RF path electrodes 32 and 34, improves tuning reliability, improves switching speed, provides high RF performance, and reduces the required driving voltage. It has been found, for example, that the RF MEMS device 10 operates on one or two volts instead of the approximately 30 to 40 volts used for a conventional RF MEMS switch. Also, as was previously alluded to, because the displacement of the PZT thin film actuator 16 can be varied by varying the voltage applied to the RF MEMS device 10, the RF MEMS device 10 may be used as either a tunable capacitor or an RF MEMS switch. Accordingly, the RF MEMS device 10 is not limited to the on/ff nature of electrostatic switches. The switching time of the RF MEMS device 10 is on the order of nanoseconds, which is comparatively better than that of electrothermal RF MEMS switches, which typically have a switching time on the order of milliseconds or microseconds. In addition to the foregoing functional advantages, the RF MEMS device 10 is a relatively simple structure packaged in a relatively small volume.

Figure 2:
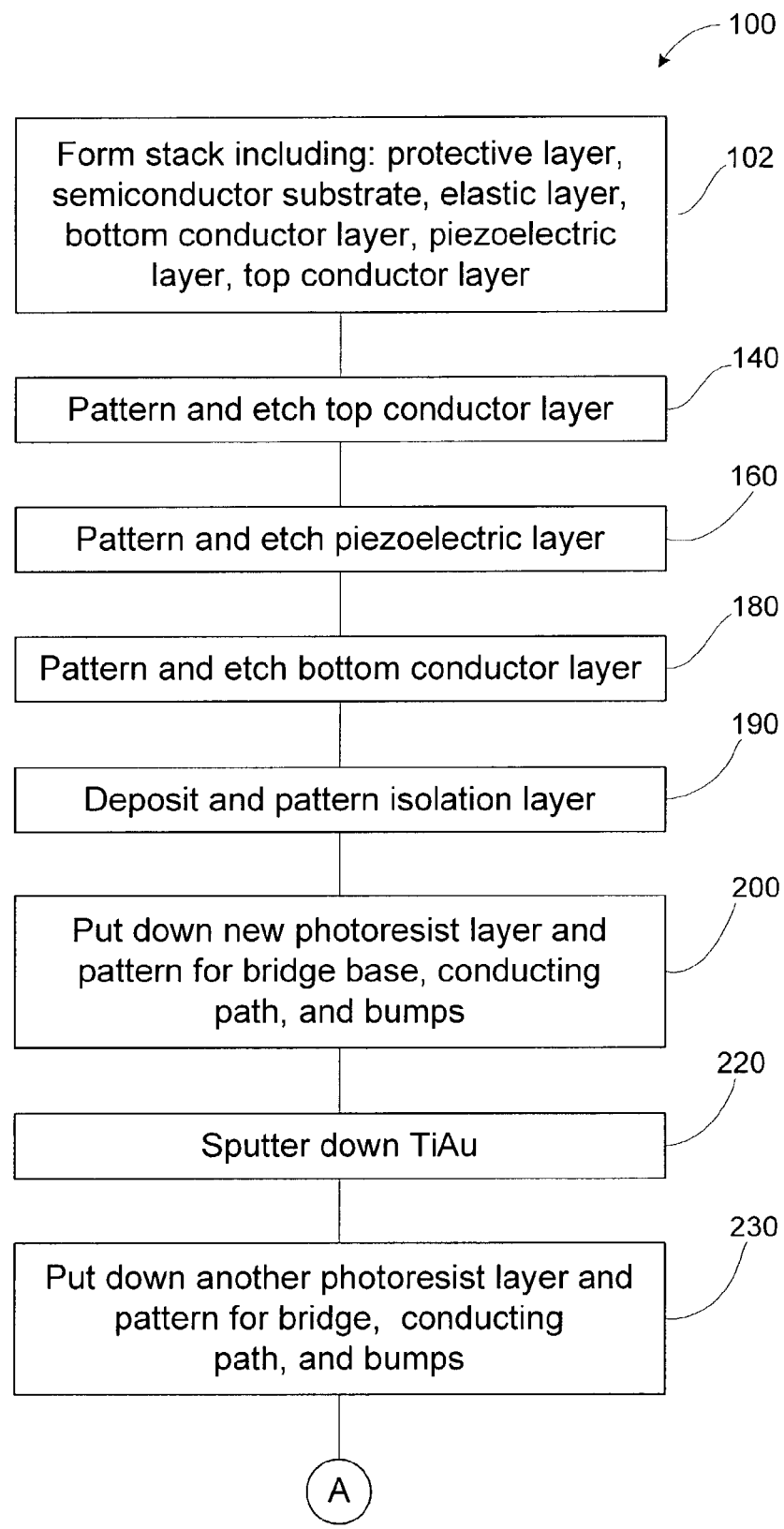
FIG. 2 is a flow chart of a method of making a radio frequency (RF) microelectromechanical system (MEMS) device in accordance with the present invention.
Figure 2:
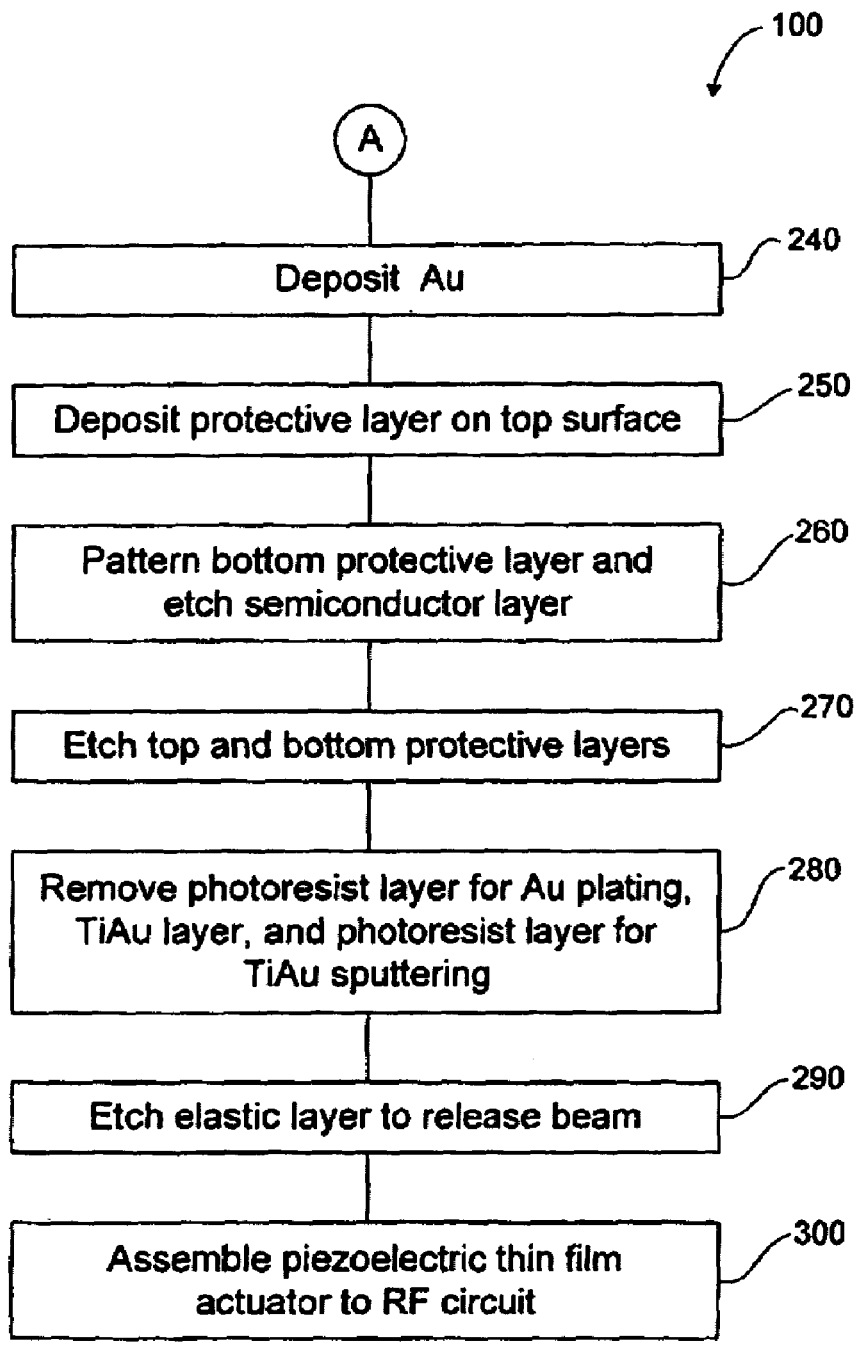

The steps of a method 100 for fabricating a radio frequency (RF) microelectromechanical system (MEMS) device 110 in accordance with the present invention are outlined in the flow chart shown in FIG. 2. FIGS. 3–10 illustrate various steps of the method 100. It will be appreciated that the method 100 and the RF MEMS device 110 described below are merely exemplary, and that suitable variations in materials, thicknesses, and/or structures may alternatively be used in the method 100 and/or the RF MEMS device 110.

Initially in step 102, a multi-layer starting material or stack used to form an RF MEMS device 110 in accordance with the invention is provided. As is shown in FIGS. 3a and 3b, the stack includes a semiconductor substrate 112, a protective layer 114 below the substrate 112, and an elastic layer 116 atop the substrate 112. A first conductor layer 120, a piezoelectric layer 126, and a second conductor layer 130 are atop the elastic layer 116, in that order. In the illustrated exemplary embodiment, the piezoelectric layer 126 is made of lead zirconate titanate (PZT). As will be appreciated, alternative suitable piezoelectric materials may be employed as the piezoelectric layer 126.

It will be appreciated that well-known materials and methods may be used to form the stack shown in FIGS. 3a and 3b. A suitable semiconductor substrate 112 material may be silicon (Si), for example. The protective layer 114 and elastic layer 116 may be made of silicon nitride ($Si_3N_4$) or silicon dioxide ($SiO_2$), for example. The conductor layers 120 and 130 may be made of platinum (Pt) or other suitable conducting materials. Also, although not specifically shown in the several figures, an adhesion layer made of, for example, tantalum (Ta), may be disposed between the conductor layer 120 and the elastic layer 116 to improve the adhesion of the conductor layer 120 to the elastic layer 116.

In the illustrated exemplary embodiment of the method 100 for fabricating the RF MEMS device 110, the PZT layer 126 has a thickness between about 4500 and about 5500 Angstroms (Å), and the elastic layer 116 has a thickness between about 0.95 microns (μm) and about 1.65 microns (μm) for silicon nitride, and between about 1.35 microns (μm) and about 1.65 microns (μm) for silicon dioxide.

In step 140 of the method 100, the top conductor layer 130 is patterned and etched down to the PZT layer 126. In particular, portions of the conductor layer 130 are removed, thereby leaving an upper conductor pad 144, an upper PZT actuator electrode 146, a conducting path electrode 152, and three spacers or bumps 154, 155 and 156, as shown in FIGS. 4a and 4b.

It will be appreciated that suitable selective etching methods are well-known in the art. For example, a mask may be placed on the stack to protect portions of the underlying layers. Formation of the mask may involve depositing a photoresist on the stack, patterning the photoresist, exposing portions of the photoresist such as by selective light exposure, and removing unexposed portions of the photoresist through use of a suitable etching technique, for example, dry etching or wet etching.

In the illustrated exemplary embodiment of the method 100 of fabricating the RF MEMS device 110, the upper PZT actuator electrode 146 has a length (from left to right in FIG. 4a) between about 300 microns (μm) and about 500 microns (μm), and a width between about 100 microns (μm) and about 150 microns (μm). The conducting path electrode 152 has a width (from left to right in FIG. 4a) between about 90 microns (μm) and about 110 microns (μm). The length of the conducting path electrode 152 (from top to bottom in FIG. 4a) is based mainly on the width of the conducting path electrode 152, as well as an RF circuit to which the stack is later mounted, and the distance between the RF-in conducting path and the RF-out conducting path, described below in greater detail with reference to FIGS. 10a–10c. The distance between the distal end of the upper PZT actuator electrode 146 (the rightmost portion of the upper PZT electrode in FIG. 4a) and the conducting path electrode 152 is at least about 100 microns (μm). It will be appreciated that other dimensions may also be suitable, depending on, for example, the desired amount of deflection to be provided by the PZT thin film actuator beam.

Thereafter, in step 160, the PZT layer 126 is patterned and etched down to the bottom conductor layer 120. In step 160, a new photoresist is deposited and patterned so that portions of the PZT layer 126 are removed, thereby leaving the upper conductor pad 144, the upper PZT actuator electrode 146, the conducting path electrode 152, and the three bumps 154, 155 and 156, as well as a PZT isolation region 170, as shown in FIGS. 5a and 5b. The PZT isolation region 170 provides high isolation in that it prevents any electric field of the conducting path electrode 152 from extending to the upper PZT actuator electrode 146, or vice versa. In the illustrated exemplary embodiment, the isolation region 170 is at least about 100 microns (μm) wide.

In step 180, illustrated in FIGS. 6a and 6b, a pattern and etch of the bottom conductor layer 120 is performed to form a lower conductor pad 184 and a lower PZT actuator electrode 186, leaving the structure shown in FIGS. 6a and 6b. Thus, much of the surface area that is removed from the bottom conductor layer 120 is similar to that which was removed from the top conductor layer 130 and the PZT layer 126, except that the bottom conductor layer 120 additionally forms the lower conductor pad 184. The lower conductor pad 184 is about the same size and shape in plan view as the upper conductor pad 144 (FIG. 6a), and includes a conducting leg or path 188 extending to the lower PZT actuator electrode 186, which is disposed below the PZT layer 126 and the upper PZT actuator electrode 146.

In step 190, an isolation layer 192 of silicon nitride or silicon dioxide is deposited on the structure shown in FIGS. 7a and 7b, and then patterned for the existing conducting path electrode 152 and three bumps 154, 155 and 156, as well as for the formation of a new bump 204 (to be formed later) in the upper left corner of FIG. 7a, and a bridge post 194 on the upper conductor pad 144 and the upper PZT actuator electrode 146. The isolation layer 192 prevents or at least substantially reduces electrical arcing between the upper and lower PZT actuator electrodes 146 and 186.

In step 200, a new photoresist (not shown) is deposited on the structure shown in FIGS. 7a and 7b, and then patterned for the existing conducting path electrode 152 and three bumps 154, 155 and 156, the new bump 204 (to be formed later), and a bridge base 208 (also to be formed later) extending from the upper conductor pad 144 to the upper PZT actuator electrode 146. Thereafter, in step 220, illustrated in FIGS. 8a and 8b, a relatively thin layer, for example one micron (μm), of TiAu 222 is sputtered on the photoresist layer. The photoresist layer controls the deposit of the TiAu to the conducting path electrode 152, the bridge base 208 and the bumps 154, 155, 156 and 204. The TiAu base layer 222 improves the adhesion of a conductive layer such as gold (to be deposited later). As will be appreciated, any suitable material to improve the adhesion of gold may be used, for example, NiCr/Au, Ta/Au, or Cr/Au. For the sake of clarity, the TiAu layer of the conducting path electrode 152 and the bumps 154, 155, 156 and 204 is shown in FIGS. 8a and 8b to identify the positions at which the TiAu is sputtered on the underlying material.

Thereafter, in step 230, a photoresist 232 (FIGS. 9a and 9b) is deposited on the structure shown in FIGS. 8a and 8b, and then patterned for the conducting path electrode 152, the bridge base 208 and the bumps 154, 155, 155 and 204. In step 240, a layer of gold 238 is then plated on the exposed portions not covered by the photoresist 232 to form the conducting path electrode 152, a bridge on the bridge base 208, and the bumps 154, 155, 156 and 204. As is shown in FIG. 9b, the height of the gold bumps 154, 155, 156 and 204 is greater than the height of either the gold bridge 208 or the gold conducting path electrode 152. As will be appreciated, alternative materials to gold may be used, for example, copper.

Next, in step 250, a protective layer (not shown) made of, for example, silicon nitride is deposited on the top surface of the stack of FIGS. 9a and 9b. The protective layer provides a mask or etch protection for the top surface. Then, in step 260, the bottom protective layer 114 is patterned to form a trench region 262. As is shown in FIGS. 10a and 10b, the semiconductor layer 112 is etched to form the trench region 262 therein. The trench region 262 has a footprint larger than the distal end of the upper and lower PZT actuator electrodes 146 and 186 and the PZT layer 126 disposed therebetween. The depth of the trench region 262 is through the thickness of the semiconductor layer 112, that is, to the elastic layer 116. The width of the trench region 262 (from top to bottom in FIG. 10a) is greater than the length of the conducting path electrode 152, and the length of the trench region 262 (from left to right in FIG. 10a) is greater than the combined width of the isolation region 170 and the conducting path electrode 152.

In step 270, the top protective layer and the bottom protective layer 114 are etched. Then, in step 280, illustrated in FIGS. 10a–10c, the photoresist layer 232 for gold plating is removed, the TiAu layer that is not the conducting path electrode 152 is removed, the bridge 208 and the bumps 154, 155, 155 and 204 are removed, and the photoresist layer for the TiAu sputtering is removed.

In step 290, also illustrated in FIGS. 10a–10c, the elastic layer 116 is removed in the region 292 laterally of, and the region 294 longitudinally beyond, the distal end of the upper and lower PZT actuator electrodes 146 and 186 and the PZT layer 126. Removing the elastic layer 116 in such a manner releases the distal end of the PZT thin film actuator 296 from the semiconductor substrate 112. The distal end of the PZT thin film actuator 296 is thus movable up and down (in FIG. 10b) within the trench region 262 and, in this regard, functions in a manner similar to a cantilever beam. As will be appreciated, the desired amount of flexure in the cantilevered end of the PZT thin film actuator 296 may be defined by the length of the trench region 262 and the length of the cantilevered end of the PZT thin film actuator 296.

Thereafter, in step 300, illustrated in FIGS. 11a–11c, the PZT thin film actuator 296 is mounted to an RF circuit substrate 302 using, for example, flip chip technology. The RF circuit substrate 302 in one embodiment is made of a suitable RF compatible material, for example, GaAs or ceramics. The resulting structure is the RF MEMS device 110. As is shown in FIGS. 11a and 11b, the bumps 154, 155, 156 and 204 provide spacing between the PZT thin film actuator 296 and the RF circuit substrate 302. Also, because the height of the bumps 154, 155, 156 and 204 is greater than the height of either the bridge 208 or the conducting path electrode 152, the bridge 208 and conducting path electrode 152 are elevated from the RF circuit substrate 302.

As is shown in FIG. 11c, an RF-in conducting path 304 and an RF-out conducting path 306 are disposed on the RF circuit substrate 302. The RF-in and RF-out conducting paths 304 and 306 are spaced apart by a gap L. As was alluded to above, the length of the conducting path electrode 152 is based mainly on the width of the conducting path electrode 152 and the gap L between the RF-in and RF-out conducting paths 304 and 306. In the illustrated exemplary embodiment of the RF MEMS device 110, the gap L between the RF-in and RF-out conducting paths 304 and 306 is about 100 microns (μm) and the length of the conducting path electrode 152 is about 250 microns (μm).

Although the invention has been shown and described with respect to certain illustrated embodiments, equivalent alterations and modifications will occur to others skilled in the art upon reading and understanding this specification and the annexed drawings. In particular regard to the various functions performed by the above described integers (components, assemblies, devices, compositions, etc.), the terms (including a reference to a "means") used to describe such integers are intended to correspond, unless otherwise indicated, to any integer which performs the specified function of the described integer (i.e., that is functionally equivalent), even though not structurally equivalent to the disclosed structure which performs the function in the herein illustrated exemplary embodiment or embodiments of the invention. In addition, while a particular feature of the invention may have been described above with respect to only one of several illustrated embodiments, such feature may be combined with one or more other features of the other embodiments, as may be desired and advantageous for any given or particular application.

The present invention includes all such equivalents and modifications, and is limited only by the scope of the following claims.

What is claimed is:

1. A radio frequency (RF) micro electro-mechanical system (MEMS) device, comprising:
   an RF circuit substrate and an RF conducting path disposed on the RF circuit substrate;
   a piezoelectric thin film actuator having a proximal end that is fixed relative to the RF circuit substrate and a cantilever end that is spaced from the RF circuit substrate, wherein the piezoelectric thin film actuator includes a first electrode, a second electrode, an elastic layer disposed on the second electrode, an isolation layer provided on the elastic layer along a plane substantially parallel to a surface of the RF circuit substrate, and a piezoelectric layer disposed between the first and second electrodes such that when a voltage potential is applied to the first and second electrodes, the isolation layer reduces electrical arcing between the first and second electrodes, wherein the first and second electrodes have a length between about 300 microns (μm) and about 500 microns (μm); and a conducting path electrode disposed on the cantilever end of the piezoelectric thin film actuator;

wherein the cantilever end of the piezoelectric thin film actuator is movable between a first position whereat the conducting path electrode is spaced from the RF conducting path a first distance and a second position whereat the conducting path electrode is spaced from the RF conducting path a second distance, and wherein the second distance is less than the first distance.

2. The RF MEMS device of claim 1, wherein the piezoelectric thin film actuator includes a layer of lead zirconate titanate (PZT) material.

3. The RF MEMS device of claim 1, wherein the first electrode and second electrode include a layer of platinum.

4. The RF MEMS device of claim 1, wherein the elastic layer includes a layer of silicon nitride.

5. The RF MEMS device of claim 1, wherein the piezoelectric layer has a thickness between about 4500 and about 5500 Angstroms (Å).

6. The RF MEMS device of claim 1, wherein the elastic layer has a thickness between about 0.95 microns (μm) and about 1.65 microns (μm).

7. The RF MEMS device of claim 1, wherein the conducting path electrode is spaced from either of the first and second electrodes by an isolation region to prevent any electric field from the conducting path electrode to the first and second electrodes, or vice versa.

8. A radio frequency (RF) micro electro-mechanical system (MEMS) device, comprising:

an RF circuit substrate and an RF conducting path disposed on the RF circuit substrate, wherein the RF circuit substrate includes a GaAs layer;

a piezoelectric thin film actuator having a proximal end that is fixed relative to the RF circuit substrate and a cantilever end that is spaced from the RF circuit substrate, wherein the piezoelectric thin film actuator includes a first electrode, a second electrode, an elastic layer disposed on the second electrode, an isolation layer provided on the elastic layer along a plane substantially parallel to a surface of the RF circuit substrate, and a piezoelectric layer disposed between the first and second electrodes such that when a voltage potential is applied to the first and second electrodes, the isolation layer reduces electrical arcing between the first and second electrodes, wherein the first and second electrodes have a length between about 300 microns (μ) and 500 microns (μ); and a conducting path electrode disposed on the cantilever end of the piezoelectric thin film actuator;

wherein the cantilever end of the piezoelectric thin film actuator is movable between a first position whereat the conducting path electrode is spaced from the RF conducting path a first distance and a second position whereat the conducting path electrode is spaced from the RF conducting path a second distance, and where the second distance is less than the first distance.

9. The RF MEMS device of claim 8, wherein the piezoelectric thin film actuator includes a layer of lead zirconate titanate (PZT) material.

10. The RF MEMS device of claim 8, wherein the first electrode and second electrode include a layer of platinum.

11. The RF MEMS device of claim 8, wherein the elastic layer includes a layer of silicon nitride.

12. The RF MEMS device of claim 8, wherein the piezoelectric layer has a thickness between about 4500 and about 5500 Angstroms Å.

13. The RF MEMS device of claim 8, wherein the elastic layer has a thickness between about 0.95 microns (μ) and about 1.65 microns (μ).

14. The RF MEMS device of claim 9, wherein the conducting path electrode is transverse the longitudinal extent of the piezoelectric thin film actuator and has a width between about 90 microns (μ) and about 110 microns (μ).

15. The RF MEMS device of claim 8, wherein the conducting path electrode is spaced from either of the first and second electrodes by an isolation region to prevent any electric field from the conducting path electrode to the first and second electrodes, or vice versa.

16. A radio frequency (RF) micro electro-mechanical system (MEMS) device, comprising:

an RF circuit substrate and an RF conducting path disposed on the RF circuit substrate;

a piezoelectric thin film actuator having a proximal end that is fixed relative to the RF circuit substrate and a cantilever end that is spaced from the RF circuit substrate, wherein the piezoelectric thin film actuator includes a first electrode, a second electrode, an elastic layer disposed on the second electrode, an isolation layer provided on the elastic layer along a plane substantially parallel to a surface of the RF circuit substrate, and a piezoelectric layer disposed between the first and second electrodes such that when a voltage potential is applied to the first and second electrodes, the isolation layer reduces electrical arcing between the first and second electrodes, wherein the first and second electrodes have a width between about 100 microns (μm) and about 150 microns (μm); and a conducting path electrode disposed on the cantilever end of the piezoelectric thin film actuator;

wherein the cantilever end of the piezoelectric thin film actuator is movable between a first position whereat the conducting path electrode is spaced from the RF conducting path a first distance and a second position whereat the conducting path electrode is spaced from the RF conducting path a second distance, and wherein the second distance is less than the first distance.

17. The RF MEMS device of claim 16, wherein the piezoelectric thin film actuator includes a layer of lead zirconate titanate (PZT) material.

18. The RF MEMS device of claim 16, wherein the first electrode and second electrode include a layer of platinum.

19. The RF MEMS device of claim 16, wherein the elastic layer includes a layer of silicon nitride.

20. The RF MEMS device of claim 16, wherein the piezoelectric layer has a thickness between about 4500 and about 5500 Angstroms (Å).

21. The RF MEMS device of claim 16, wherein the elastic layer has a thickness between about 0.95 microns (μm) and about 1.6 microns (μm).

22. The RF MEMS device of claim 16, wherein the conducting path electrode is spaced from either of the first and second electrodes by an isolation region to prevent any electric field from conducting path electrode to the first and second electrodes, or vice versa.

23. A radio frequency (RF) micro electro-mechanical system (MEMS) device, comprising:

an RF circuit substrate and an RF conducting path disposed on the RF circuit substrate;

a piezoelectric thin film actuator having a proximal end that is fixed relative to the RF circuit substrate and a cantilever end that is spaced from the RF circuit substrate, wherein the piezoelectric thin film actuator includes a first electrode, a second electrode, an elastic layer disposed on the second electrode, an isolation layer provided on the elastic layer along a plane substantially parallel to a surface of the RF circuit substrate, and a piezoelectric layer disposed between the first and second electrodes such that when a voltage potential is applied to the first and second electrodes, the isolation layer reduces electrical arcing between the first and second electrodes; and a conducting path electrode disposed on the cantilever end of the piezoelectric thin film actuator;

wherein the cantilever end of the piezoelectric thin film actuator is movable between a first position whereat the conducting path electrode is spaced from the RF conducting path a first distance and a second position whereat the conducting path electrode is spaced from the RF conducting path a second distance, and wherein the second distance is less than the first distance; and wherein the conducting path electrode is transverse the longitudinal extent of the piezoelectric thin film actuator and has a width between about 90 microns (μm) and about 110 microns (μm).

24. The RF MEMS device of claim 23, wherein the piezoelectric think film actuator includes a layer of lead zirconate titanate (PZT) material.

25. The RF MEMS device of claim 23, wherein the first electrode and second electrode include a layer of platinum.

26. The RF MEMS device of claim 23, wherein the elastic layer includes a layer of silicon nitride.

27. The RF MEMS device of claim 23, wherein the piezoelectric layer has a thickness between about 4500 and about 5500 Angstroms (Å).

28. The RF MEMS device of claim 23, wherein the elastic layer has a thickness between about 0.95 microns (μm) and about 1.65 microns (μm).

29. The RF MEMS device of claim 23, wherein the conducting path electrode is spaced from either of the first and second electrodes by an isolation region to prevent any electric field from the conducting path electrode to the first and second electrodes, or vice versa.

30. A radio frequency (RF) micro electro-mechanical system (MEMS) device, comprising:

an RF circuit substrate and an RF conducting path disposed on the RF circuit substrate;

a piezoelectric thin film actuator having a proximal end that is fixed relative to the RF circuit substrate and a cantilever end that is spaced from the RF circuit substrate, wherein the piezoelectric thin film actuator includes a first electrode, a second electrode, an elastic layer disposed on the second electrode, an isolation layer provided on the elastic layer along a plane substantially parallel to a surface of the RF circuit substrate, and a piezoelectric layer disposed between the first and second electrodes such that when a voltage potential is applied to the first and second electrodes, the isolation layer reduces electrical arcing between the first and second electrodes; and a conducting path electrode disposed on the cantilever end of the piezoelectric thin film actuator;

wherein the cantilever end of the piezoelectric thin film actuator is movable between a first position whereat the conducting path electrode is spaced from the RF conducting path a first distance and a second position whereat the conducting path electrode is spaced from the RF conducting path a second distance, and wherein the second distance is less than the first distance, wherein the RF conducting path includes an RF-in path electrode and an RF-out path electrode, each extending transverse the piezoelectric thin film actuator, the RF-in and RF-out path electrodes being spaced apart by a gap L.

31. The RF MEMS device of claim 30, wherein the piezoelectric thin film actuator includes a layer of lead zirconate titanate (PZT) material.

32. The RF MEMS device of claim 30, wherein the first electrode and second electrode include a layer of platinum.

33. The RF MEMS device of claim 30, wherein the elastic layer includes a layer of silicon nitride.

34. The RF MEMS device of claim 30, wherein the piezoelectric layer has a thickness between about 4500 and about 5500 Angstroms (Å).

35. The RF MEMS device of claim 30, wherein the elastic layer has a thickness between about 0.95 microns (μm) and about 1.65 microns (μm).

36. The RF MEMS device of claim 30, wherein the conducting path electrode is spaced from either of the first and second electrodes by an isolation region to prevent any electric field from the conducing path electrode to the first and second electrodes, or vice versa.

37. The RF MEMS device of claim 30, wherein the conducting path electrode is transverse the longitudinal extent of the piezoelectric thin film actuator and has a length at least as long as the gap L between the RF-in and RF-out path electrodes.

38. A radio frequency (RF) micro electro-mechanical system (MEMS) device, comprising:

an RF circuit substrate and an RF conducting path disposed on the RF circuit substrate, wherein the RF circuit substrate includes a GaAs layer;

a piezoelectric thin film actuator having a proximal end that is fixed relative to the RF circuit substrate and a cantilever end that is spaced from the RF circuit substrate, wherein the piezoelectric thin film actuator includes a first electrode, a second electrode, an elastic layer disposed on the second electrode, an isolation layer provided on the elastic layer along a plane substantially parallel to a surface of the RF circuit substrate, and a piezoelectric layer disposed between the first and second electrodes such that when a voltage potential is applied to the first and second electrodes, the isolation layer reduces electrical arcing between the first and second electrodes wherein the first and second electrodes have a width between about 100 microns (μ) and about 150 microns(μ); and a conducting path electrode disposed on the cantilever end of the piezoelectric thin film actuator;

wherein the cantilever end of the piezoelectric thin film actuator is movable between a first position whereat the conducting path electrode is spaced from the RF conducting path a first distance and a second position whereat the conducting path electrode is spaced from the RF conducting path a second distance, and where the second distance is less than the first distance.

39. The RF MEMS device of claim 38, wherein the piezoelectric thin film actuator includes a layer of lead zirconate titanate (PZT) material.

40. The RF MEMS device of claim 38, wherein the first electrode and second electrode include a layer of platinum.

41. The RF MEMS device of claim 38, wherein the elastic layer includes a layer of silicon nitride.

42. The RF device of claim 38, wherein the piezoelectric layer has a thickness between about 4500 and about 5500 Angstroms Å.

43. The RF MEMS device of claim 38, wherein the elastic layer has a thickness between about 0.95 microns (μ) and about 1.65 microns (μ).

44. The RF MEMS device of claim 39, wherein the conducting path electrode is transverse the longitudinal extent of the piezoelectric thin film actuator and has a width between about 90 microns (μ) and about 110 microns (μ).

45. The RF MEMS device of claim 38, wherein the conducting path electrode is spaced from either of the first and second electrodes by an isolation region to prevent any electric field from the conducting path electrode to the first and second electrodes, or vice versa.

46. A radio frequency (RF) micro electro-mechanical system (MEMS) device, comprising:
   an RF circuit substrate and an RF conducting path disposed on the RF circuit substrate;
   a piezoelectric thin film actuator having a proximal end that is fixed relative to the RF circuit substrate and a cantilever end that is spaced from the RF circuit substrate, wherein the piezoelectric thin film actuator includes a first electrode, a second electrode, an elastic layer disposed on the second electrode, an isolation layer provided on the elastic layer along a plane substantially parallel to a surface of the RF circuit substrate, and a piezoelectric layer disposed between the first and second electrodes such that when a voltage potential is applied to the first and second electrodes, the isolation layer reduces electrical arcing between the first and second electrodes; and
   a conducting path electrode disposed on the cantilever end of the piezoelectric thin film actuator,
   wherein the cantilever end of the piezoelectric thin film actuator is movable between a first position whereat the conducting path electrode is spaced from the RF conducting path a first distance and a second position whereat the conducting path electrode is spaced from the RF conducting path a second distance, and where the second distance is less than the first distance,
   wherein the RF circuit substrate includes a GaAs layer, wherein the RF conducting path includes an RF-in path electrode and an RF-out electrode, each extending transverse the piezoelectric thin film actuator, the RF-in and RF-out path electrodes being spaced apart by a gap L and wherein the conducting path electrode is transverse the longitudinal extent of the piezoelectric thin film actuator and has a length at least as long as the gap L between the RF-in and RF-out path electrodes.

47. The RF MEMS device of claim 46, wherein the piezoelectric thin film actuator includes a layer of lead zirconate titanate (PZT) material.

48. The RF MEMS device of claim 46, wherein the first electrode and second electrode include a layer of platinum.

49. The RF MEMS device of claim 46, wherein the elastic layer includes a layer of silicon nitride.

50. The RF MEMS device of claim 46, wherein the piezoelectric layer has a thickness between about 4500 and about 5500 Angstroms.

51. The RF MEMS device of claim 46, wherein the elastic layer has a thickness between about 0.95 microns (μ) and about 1.65 microns (μ).

52. The RF MEMS device of claim 47, wherein the conducting path electrode is transverse the longitudinal extent of the piezoelectric thin film actuator and has a width between about 90 microns (μ) and about 110 microns (μ).

53. The RF MEMS device of claim 46, wherein the conducting path electrode is spaced from either of the first and second electrodes by an isolation region to prevent any electric field from the conducting path electrode to the first and second electrodes, or vice versa.

* * * * *